United States Patent
Essilfie

(10) Patent No.: US 6,777,782 B1
(45) Date of Patent: Aug. 17, 2004

(54) METHOD FOR FABRICATING BASE-EMITTER SELF-ALIGNED HETEROJUNCTION BIPOLAR TRANSISTORS

(75) Inventor: Gilbert K. Essilfie, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/367,342

(22) Filed: Feb. 13, 2003

(51) Int. Cl.[7] .................................................. H01L 29/72

(52) U.S. Cl. ...................... 257/571; 257/572; 257/574; 257/673; 257/674

(58) Field of Search ................................. 257/571, 673, 257/572, 574, 674

(56) References Cited

U.S. PATENT DOCUMENTS

2002/0155670 A1 * 10/2002 Malik ......................... 257/571

* cited by examiner

Primary Examiner—Edward Wojciechowicz

(57) ABSTRACT

A transistor and method for making the same are disclosed. The transistor is constructed from a collector layer, a base layer, and an emitter layer in a stacked arrangement. The emitter layer is etched to form a mesa on an etched surface, the mesa having a top surface that includes a portion of the emitter layer and an emitter contact and sides joining the top surface with the etched surface. First and second protective layers are then deposited over the emitter contact and etched surface and the portions of these layers that overlie the etched surface are removed. The first protective layer is then preferentially etched thereby undercutting a portion of the first protective layer on the sides of the mesa and creating an overhanging portion of the second protective layer that is utilized to align the deposition of the base contacts.

6 Claims, 4 Drawing Sheets

METHOD FOR FABRICATING BASE-EMITTER SELF-ALIGNED HETEROJUNCTION BIPOLAR TRANSISTORS

FIELD OF THE INVENTION

The present invention relates to semiconductor fabrication methods, and more particularly to heterojunction bipolar transistors.

BACKGROUND OF THE INVENTION

Vertical structure heterojunction bipolar transistors are often used in high-frequency applications such as microwave communication systems. Typically, a heterojunction bipolar transistor is constructed from a stack of semiconductor layers in which one of the layers is etched to form a mesa. Typically, it is the emitter that is constructed on the mesa, which overlies the base and collector layers in a vertical arrangement. The emitter ohmic contact is deposited on the top surface of this mesa. The base ohmic contacts are typically deposited adjacent to the mesa on the base layer. The performance of the device is critically dependent on the relative positioning of the emitter and base ohmic contacts.

One prior art method for providing the required alignment utilizes a self-alignment scheme in which the metal layer in the emitter is used to align the metal layer of the base. In these schemes, the emitter metal layer is deposited on the surface of the emitter layer and the emitter layer is then etched using the emitter metal as a mask. The base metal is subsequently deposited using the emitter metal to align the base metal. These schemes frequently involve fabricating the emitter mesa with a wet-etchant that also undercuts the emitter metal and enables the base metal that is subsequently deposited to be self-aligned to the emitter. In addition, the undercut prevents the base metal from forming a bridge that shorts the base metal to the emitter. Unfortunately, the degree of undercutting of the emitter metal in a wet-etchant process is difficult to control. Since this undercut is critical to the device, such fabrication methods have a low device performance and yield due to poor emitter size control and emitter-base shorts.

SUMMARY OF THE INVENTION

The present invention includes a transistor and method for making the same. The transistor is constructed from a collector layer, a base layer, and an emitter layer in a stacked arrangement. An emitter contact is patterned on the emitter layer, and the emitter layer is etched to form a mesa on an etched surface, the mesa having a top surface that includes a portion of the emitter layer and sides joining the top surface with the etched surface. A first protective layer is deposited over the emitter contact and the etched surface, and a second protective layer is deposited over the first protective layer. The first and second protective layers are removed over the portions thereof that overlie the etched surface, leaving a portion of the second protective layer on a portion of the sides of the mesa. The first protective layer is then etched with an etchant that removes the first protective layer faster than the second protective layer thereby undercutting a portion of the first protective layer on the sides of the mesa. A patterned metallic layer is then deposited on the etched surface at a position determined by the remaining portion of the second protective layer. The etched surface may be a portion of the base layer or a portion of the emitter layer depending on the desired transistor geometry. The protective layers are preferably dielectrics.

DETAILED DESCRIPTION OF THE PREFERRED EMBODIMENTS OF THE INVENTION

Figure 4:
FIGS. 1–4 are cross-sectional views of a prior art heterojunction transistor at various stages in the fabrication process.
Figure 1:
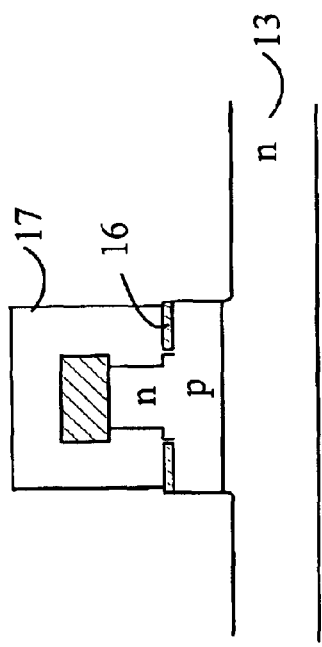
Figure 2:
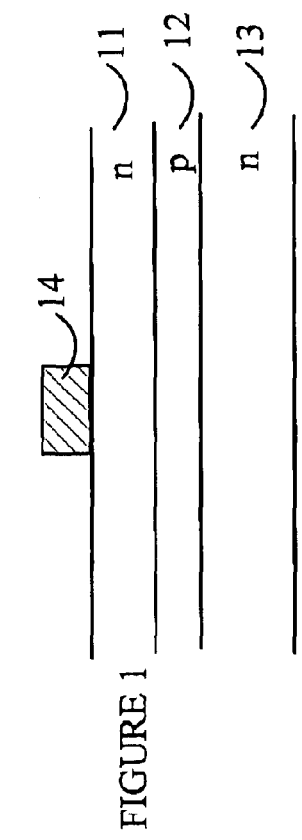
Figure 3:
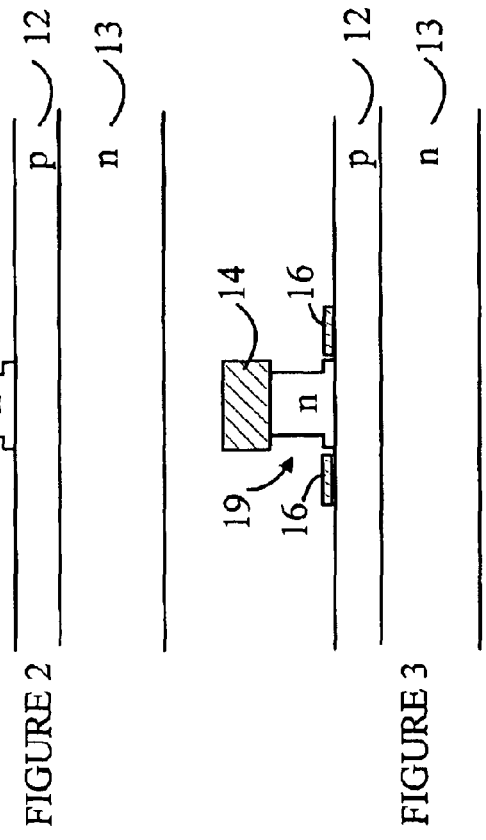

The manner in which the present invention provides its advantages can be more easily understood with reference to FIGS. 1–4, which are cross-sectional views of a prior art heterojunction transistor at various stages in the fabrication process. Referring to FIG. 1, the emitter metal layer 14 is patterned on an n-type emitter layer 11. The emitter metal layer is then used as a mask for a wet etch process that etches through emitter layer 11 to the top surface of a p-type base layer 12 which is deposited on a collector layer 13 as shown in FIG. 2. The base metal layer 16 is then deposited using the emitter metal layer 14 as a mask for the inner edge of the metal deposition as shown in FIG. 3. The emitter metal layer and most of the base metal layer are then covered with a photoresist mask 17 to protect these structures during the etching of the base layer as shown in FIG. 4. The outer edge of the base metal layer remains exposed and determines the location of the emitter-base mesa area thus assuring the correct alignment of the emitter-base mesa.

The alignment of the emitter and base electrodes depends on the accuracy of the undercut. In addition, only air gap 19 shown in FIG. 3 prevents the base metal from shorting to the emitter electrode 14 during the deposition of base metal layer 16. If the undercut is insufficient, a metal bridge can be formed between emitter electrode 14 and base metal layer 16 thereby shorting the base to the emitter. As noted above, the wet-etch undercut of the emitter metal layer is difficult to control. Errors in this etch step lead to poor emitter size control and emitter-base shorts. Such errors reduce the device yield, and hence, increase the cost of the transistors.

Figure 5:
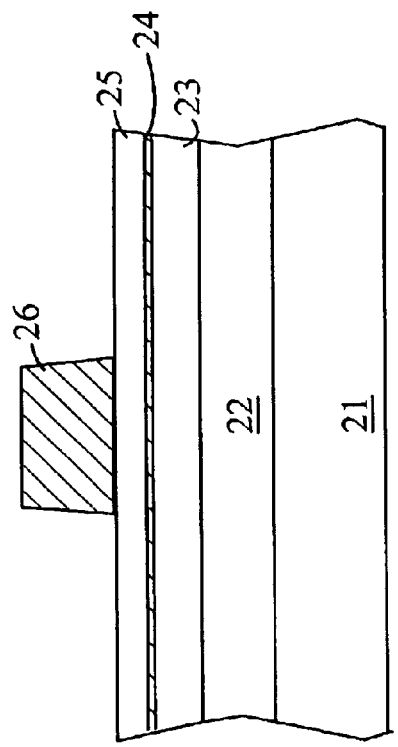
FIGS. 5–11 are cross-sectional views of a heterojunction transistor according to the present invention at various stages in the fabrication process.

The present invention overcomes these problems by eliminating the need for undercutting the emitter-metal layer via a wet-etchant process. Refer now to FIGS. 5–11, which are cross-sectional views of a heterojunction transistor according to the present invention at various stages in the fabrication process. The patterning steps begin with a substrate 21 that has a collector contact layer 22, collector layer 23, base layer 24, and emitter layer 25 as shown in FIG. 5.

It should be understood that the various layers may include a plurality of sub-layers. For example, in one embodiment of the present invention, the emitter layer is constructed from three sub-layers. The uppermost layer an n-doped InGaAs layer that is doped with Si to a level of $1 \times 10^{19}$ atoms/cm$^3$. This InGaAs layer is deposited on an n-doped InAlAs layer having a dopant concentration of $3 \times 10^{17}$ atoms/cm$^3$. The InAlAs layer is deposited on a super lattice layer having alternating undoped InGaAs and AlInAs layers. In this example, the base layer has two sub-layers, a p-doped InGaAs layer having a dopant concentration of $3 \times 10^{19}$ C atoms/cm$^3$, deposited on an undoped super lattice layer having alternating undoped InGaAs and AlInAs layers. The collector layer is constructed from a layer of n-doped InP having a dopant concentration of $5 \times 10^{16}$ Si atoms/cm$^3$ deposited on an n-doped InGaAs layer having a dopant concentration of $1 \times 10^{19}$ Si atoms/cm$^3$. The sub-collector contact layer is a single n-doped Inp layer having a dopant concentration of $6 \times 10^{18}$ Si atoms/cm$^3$.

Figure 6:
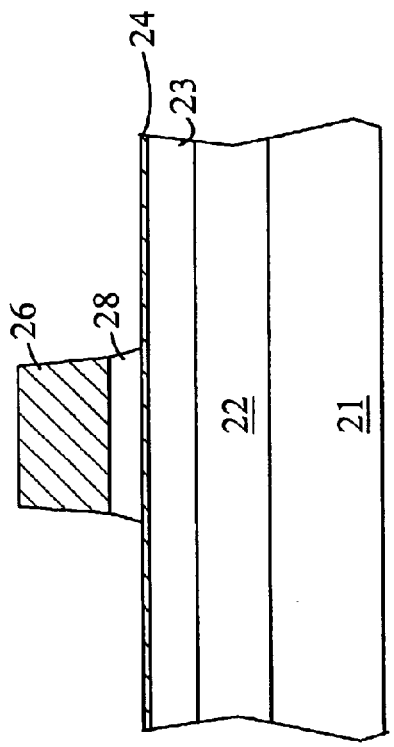

The patterning process begins with the deposition of metallic emitter electrode 26 by conventional deposition techniques. The emitter electrode is then used as a mask for etching emitter layer 25 to provide the emitter 28 of the transistor as shown in FIG. 6. The etching operation is preferably accomplished via a chlorine-based reactive ion etch (RIE) or a high-density plasma etch.

Figure 7:
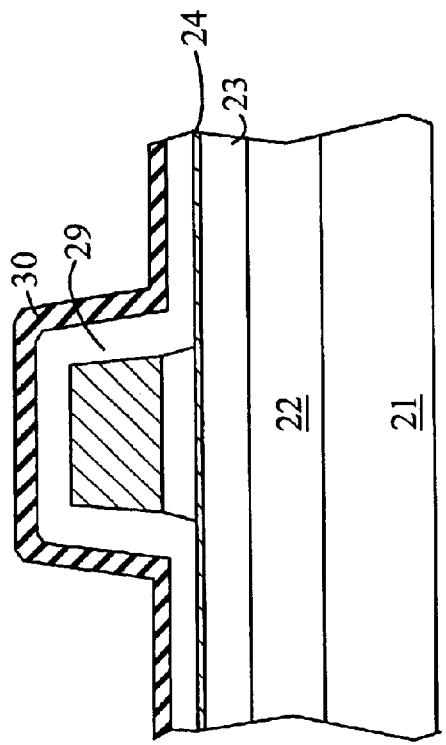

Next, a 300 nm layer 29 of silicon nitride and a 100 nm layer 30 of silicon dioxide are deposited as shown in FIG. 7. These layers are preferably deposited by PECVD.

Figure 8:
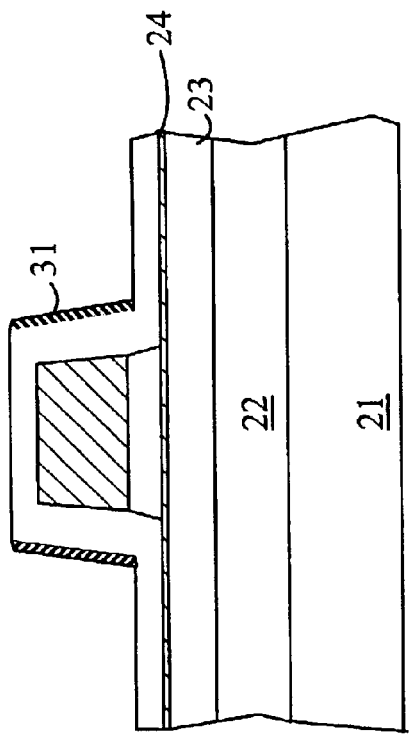

The portions of the silicon dioxide on the horizontal surfaces are then removed as shown in FIG. 8. This etching operation is preferably performed using a low pressure, high-bias anisotropic CF4-based RIE. The etch is monitored by laser reflectometry or a fixed time based on the etch rate of silicon dioxide to produce a minimal over-etch into the silicon nitride layer. After this etching operation, a thin layer 31 of silicon dioxide remains on the vertical surfaces of the silicon nitride.

Figure 9:
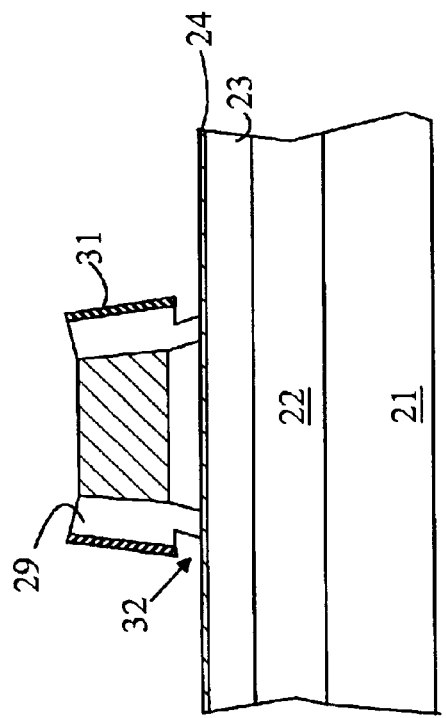

Refer now to FIG. 9. Next, the portions of the silicon nitride layer that are not protected by silicon dioxide layer 31 are etched using a high pressure, low-bias isotropic SF6-based RIE. This etching operation removes silicon nitride at a rate that is greater than 8 times the rate at which silicon dioxide is removed. This operation undercuts the dielectric area as shown at 32.

Figure 11:
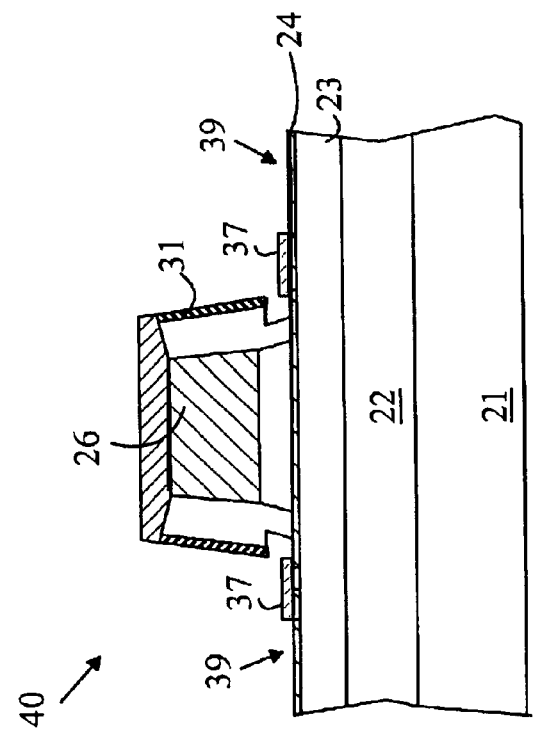
Figure 10:
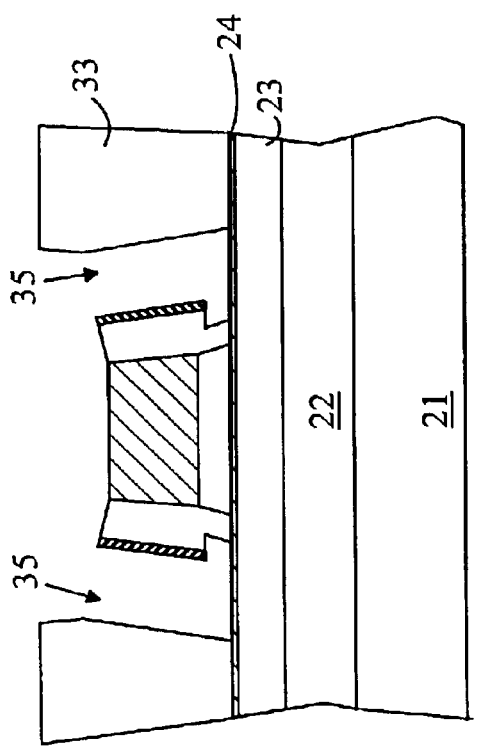

Next, the base electrodes are deposited with the aid of a photoresist mask 33 as shown in FIG. 10. The base contacts 37 are preferably deposited on base layer 24 through the openings 35 in photoresist mask 33 via electron-beam evaporation. After the deposition of the base contacts 37, photoresist mask 33 is removed leaving the transistor as shown in FIG. 11 at 40. The portion of the base layer shown at 39 is removed by an etching operation that isolates the various devices constructed on the substrate. Since such isolation is known to the art, it will not be discussed in detail here.

It should be noted that the alignment of the base electrode with respect to the emitter region is determined by the position of the dielectric layer 31, not by a difficult to control undercut etching operation. The position of the dielectric layer depends on the precision with which layers 29 and 30 shown in FIG. 7 are deposited and on the precision of the etching of these layers. The thickness of the layers in question can be precisely controlled. Furthermore, the RIE used to etch these layers is much more controllable than the wet etch used in prior art devices.

Figure 12:
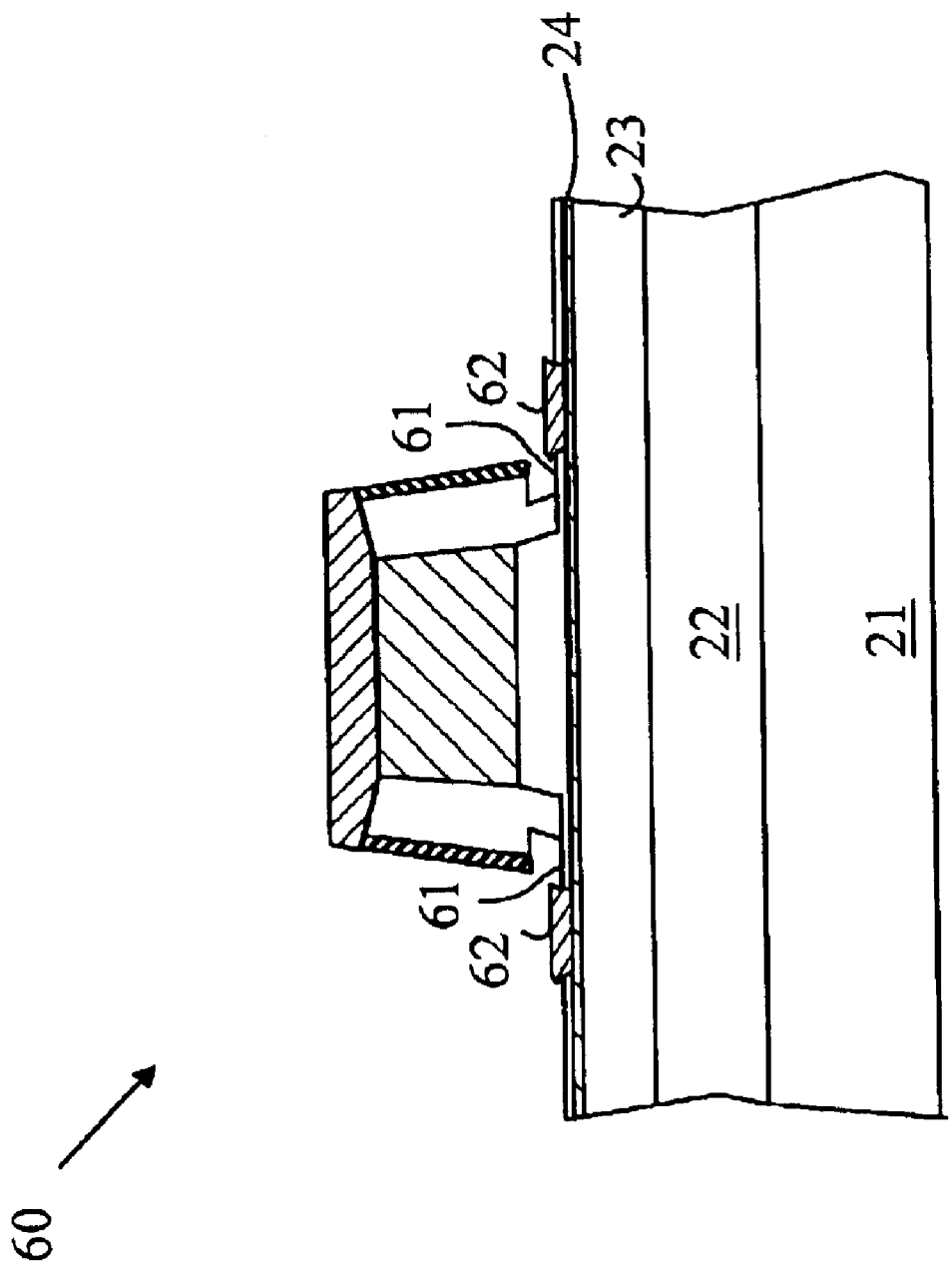
FIG. 12 is a cross-sectional view of a transistor 60 in which a thin emitter layer is also connected to the base metalization.

The method of the present invention can also be utilized to fabricate a modified transistor in which a thin layer of emitter material is also connected to the base metalization. Refer now to FIG. 12, which is a cross-sectional view of a transistor 60 in which a thin emitter layer is also connected to the base metalization. To simplify the following discussion, those elements of transistor 60 that are the same as the elements of transistor 40 shown in FIG. 11 have been given the same numeric designations as used in FIG. 11. Transistor 60 includes a thin layer of emitter material shown at 61 that connects to the base electrodes 62.

Transistor 60 is constructed by a manner that is analogous to that described above with reference to transistor 40. The fabrication process for transistor 60 differs in that the etching of the emitter layer 25 shown in FIG. 5 is halted before the emitter layer is completely removed in the regions that are not protected by electrode 26. This leaves a thin layer of emitter material of approximately 300 Angstroms over the surface of base layer 24. The fabrication of the transistor then continues as described above with respect to transistor 40 through the deposition of the photoresist mask 33 shown in FIG. 10. At this point, the photoresist mask is used to define an etch window on the thin layer of emitter material. The material in this window is then etched through the layer of emitter material and terminates on the surface of the underlying base layer. This etching operation is preferably performed using a Chlorine-based RIE. Metal electrode 62 is then deposited through the mask, and the mask and any excess metal are then removed leaving transistor 60 as shown in FIG. 12.

Transistor 60 is a significant improvement over transistor 40. The thin emitter layer left on top of the base layer acts as a self-passivation layer for the base and has been shown to improve the transistor performance (i.e., current gain) and reliability. In transistor 40, the external (lateral) separation between the emitter mesa and the base ohmic contact is exposed to process-induced damage, which degrades the transistor performance.

The above-described embodiments utilize silicon nitride and silicon dioxide to provide the self-alignment structures utilized in the present invention. However, other materials can also be utilized. In general, the materials must have the property that the layer closest to the emitter material can be selectively etched without destroying the layer farthest from the emitter layer. In general, a different etch system must be selected to provide the appropriate specificity for each possible pair of materials.

The above-described embodiments of the present invention have utilized specific materials for the protective layers. However, other materials can be utilized without departing from the teachings of the present invention. For example, titanium oxide and tungsten oxide can be used in place of silicon dioxide. Both of these materials can be deposited by sputtering and etched in a high density plasma etcher with a mixture of Chlorine and Argon. In addition, Tantalum nitride may be used in place of silicon nitride and etched with an SF6 based RIE.

Various modifications to the present invention will become apparent to those skilled in the art from the foregoing description and accompanying drawings. Accordingly, the present invention is to be limited solely by the scope of the following claims.

What is claimed is:

1. A transistor comprising:
   a collector semiconductor layer, a base semiconductor layer, and an emitter semiconductor layer in a stacked arrangement, said emitter semiconductor layer comprising a mesa having a top surface, a raised portion that is elevated over a base surface, and sides extending from said top surface to said base surface;
   an emitter contact comprising a conducting layer overlying said top surface of said mesa;
   a protective layer in contact with said sides of said mesa, said protective layer having an overhang that projects outward from said mesa; and
   a base contact on said base surface, said base contact being electrically connected to said base layer and being positioned on said base surface at a point determined by said overhang.

2. The transistor of claim 1 wherein said base surface comprises a portion of said base layer.

3. The transistor of claim 1 wherein said base surface comprises a portion of said emitter layer.

4. The transistor of claim 1 wherein said protective layer comprises a dielectric.

5. The transistor of claim 4 wherein said dielectric comprises silicon dioxide.

6. The transistor of claim 1 wherein said protective layer comprises a first sub-layer in contact with said sides of said mesa and a second sub-layer in contact with said first sub-layer, said first sub-layer comprising an undercut.

* * * * *